United States Patent [19]

Chang et al.

[11] Patent Number: 4,960,656

[45] Date of Patent: Oct. 2, 1990

[54] DEVICES AND PROCESS FOR PRODUCING DEVICES CONTAINING SILICON NITRIDE FILMS

[75] Inventors: Chorng-Ping Chang, Berkeley Heights; Daniel L. Flamm, Chatham Township, Morris County; Dale E. Ibbotson, Westfield; John A. Mucha, Madison, all of N.J.

[73] Assignee: AT&T Bell Laboratories, Murray Hill, N.J.

[21] Appl. No.: 449,467

[22] Filed: Dec. 12, 1989

Related U.S. Application Data

[63] Continuation of Ser. No. 287,576, Dec. 15, 1988, abandoned, and a continuation of Ser. No. 9,789, Feb. 2, 1987, abandoned.

[51] Int. Cl.$^5$ ............................................. B32B 9/04
[52] U.S. Cl. ................................. 428/704; 427/39; 427/58
[58] Field of Search .......................... 427/38, 39, 58; 428/704

[56] References Cited

U.S. PATENT DOCUMENTS 4,464,415 8/1984 Yamazaki ............................ 427/39

OTHER PUBLICATIONS

R. C. Sun, J. T. Clemens, and J. T. Nelson, "Effects of Silicon Nitride Encapsulation on MOS Device Stability", *18th Annual Proceedings Reliability Physics 1980*, Las Vegas, Nev., Apr. 8-10, 1980, IEEE Catalog No.80 CH1531-3, New York (1980), pp. 244-251.
A. C. Adams, "Dielectric and Polysilicon Film Deposition", *VLSI Technology*, S. M. Sze, ed., McGraw-Hill Book Company, New York (1983), Chapter 3, pp. 93-129.
S. Fujita, T. Ohishi, H. Toyoshima, and A. Sasaki, "Electrical Properties of Silicon Nitride Films Plasma-Deposited from $SiF_4$, $N_2$, and $H_2$ Source Gases", *Journal of Applied Physics*, vol. 57, No. 2 (Jan. 15, 1985), pp. 426-431.
K. Horioka, T. Takahashi, K. Kasuya, J. Mizui, and T. Tazima, "Generation of Pulsed Ion Beams from Various Dielectric Materials Cooled with Cryogenic Anode", *Japanese Journal of Applied Physics*, vol. 23, No. 6 (Jun. 1984), pp. L374-L376.
W. G. Meyer and R. B. Fair, "Dynamic Behavior of the Buildup of Fixed Charge and Interface States During Hot-Carrier Injection in Encapsulated MOSFET's", *IEEE Transactions on Electron Devices*, vol. ED-30, No. 2 (Feb. 1983), pp. 96-103.
S. Fujita, H. Toyoshima, T. Ohishi, and A. Sasaki, "Plasma-Enhanced Chemical Vapor Deposition of Fluorinated Silicon Nitride", *Japanese Journal of Applied Physics*, Vol. 23, No. 3 (Mar. 1984), pp. L144-146.
S. Fujita, H. Toyoshima, T. Ohishi, and A. Sasaki, "Plasma Deposited Silicon Nitride Films from $SiF_2$ as Silicon Source", *Japanese Journal of Applied Physics*, Vol. 23, No. 5 (May 1984), pp. 268-L270.

*Primary Examiner*—Bernard Pianalto
*Attorney, Agent, or Firm*—G. Books; B. S. Schneider

[57] ABSTRACT

Silicon nitride regions suitable for applications such as capping layers in integrated circuit fabrication are produced by an advantageous plasma deposition process. This process utilizes a combination of gases, including a silicon-containing gas, a nitrogen-containing gas, a fluorine-containing gas, and a hydrogen-containing gas. Silicon nitride having a low density of defect states and thus having excellent dielectric properties is produced.

23 Claims, 1 Drawing Sheet

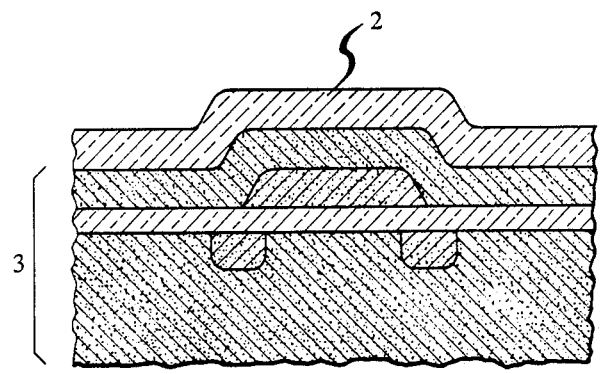

DEVICES AND PROCESS FOR PRODUCING DEVICES CONTAINING SILICON NITRIDE FILMS

This application is a continuation application Ser. No. 07/287576, filed on Dec. 15, 1988 now abandoned and continuation of application Ser. No. 009,789, filed on Feb. 2, 1987 now abandoned.

BACKGROUND OF THE INVENTION

1. Technical Field

This invention relates to device fabrication processes and in particular to device fabrication processes including the production of a silicon nitride region.

2. Art Background

Silicon nitride regions are used for many applications in the fabrication of electronic devices. For example, after the device, e.g., a semiconductor device, is fabricated, it is encapsulated in a silicon nitride material. This material is employed to prevent impurities in the ambient from reaching the device's active layers and, thus, from degrading device performance. Generally plasma deposition, a low-temperature process, is employed to avoid adversely affecting temperature-sensitive structures formed in previous processing steps. However, silicon nitride layers produced by plasma deposition can introduce other difficulties. If a high density of interface states, e.g., bulk imperfections or film instability, is produced upon deposition of the silicon nitride, device degradation rather than preservation occurs. (The density of defect states is advantageously monitored by measurement of, for example, capacitance-voltage (C-V) threshold shifts or changes in relative magnitude of breakdown voltages. These measurements are described in R. C. Sun and J. T. Clemens, "Effects of Silicon Nitride Encapsulation on MOS Device Stability", *Proceedings International Reliability Physics Symposium*, 1980, p. 244, IEEE80CH-1531-3. Film stability is measured by observing the threshold shift after accelerating thermal aging in the presence, if any, of hot carrier electrons. See, for example, W. G. Meyer and R. B. Fair, *IEEE Transactions: Electron Devices*, ED-30, 96 (1983).)

Detrimental effects on the layers underlying silicon nitride have been attributed to the presence of silicon-hydrogen bonds in the silicon nitride material. Some of these silicon-hydrogen bonds are relatively weak and tend to dissociate with subsequent migration of hydrogen through the silicon nitride material. The hydrogen produced and/or the free electrons on the associated silicon atom both contribute to trap states.

Thus, there has been a strong incentive to produce silicon nitride having a low hydrogen content and/or having strongly bonded hydrogen that is not mobile. This incentive has, in turn, yielded a concomitant desire for plasma processes which employ gases that are essentially free of hydrogen, or plasma processes that are designed to reduce or stabilize hydrogen in the silicon nitride. For example, Fujita, et al, have described the plasma discharge production of silicon nitride in *Japanese Journal of Applied Physics*, 23, L 144 (1984), *Japanese Journal of Applied Physics*, 23, L 268 (1984), and *Journal of Applied Physics*, 57, 426 (1985). This work employed (1) $SiF_4$, nitrogen, and hydrogen, or (2) $SiF_2$, nitrogen, and optionally hydrogen. The presence of extremely low levels of Si-H bonds, was inferred from the undetectable infrared absorption due to Si-H near 2200 $cm^{-1}$. This low level was purposely sought to reduce traps. However, the bulk of the material contained a substantial concentration of oxygen that indicates the chemical instability of the film upon exposure to ambient air. Additionally, the deposition rate was so low, e.g., 100 Å/min for films that result in N/Si stoichiometries of approximately 1, that the process was not desirable for device fabrication. Thus, attempts to produce a high quality silicon nitride material by plasma deposition in practice have not been particularly successful.

Other attempts to produce silicon nitride containing a relatively low concentration of hydrogen have been equally futile. As described by Furukawa in *Japanese Journal of Applied Physics*, 23, 376 (1984), the use of $NF_3$ with $SiH_4/NH_3$ mixtures in thermal CVD led to the etching of the silicon substrate and did not result in deposition.

SUMMARY OF THE INVENTION

Through the use of a particular plasma deposition process, high quality silicon nitride material is deposited. This material has a high dielectric breakdown voltage, e.g., 4 MV/cm, high resistivity, e.g., $10^{14}$ to $10^{16}$ $\Omega$-cm, flat capacitance versus frequency (C-F) curve and low dielectric constant, e.g., 4 to 5. The inventive process depends, in contrast to all expectations, not on the maintenance of a relatively low hydrogen concentration in the plasma, but on the intentional introduction of hydrogen and fluorine entities into the plasma. In particular, the process relies on the use of a gas mixture which includes (1) a source of reactive nitrogen, e.g., at least one stable nitrogen-containing gas that extensively dissociates under the plasma conditions being used, (2) a source of reactive fluorine, (3) a source of silicon including at least one silicon-containing compound that is introduced as a gas such that less than half the silicon-bonding orbitals of this compound are satisfied by fluorine, and (4) a source of a substantial level of reactive hydrogen. A separate gas is not needed to provide each of these elements and often a single gas provides more than one required entity. Silicon tetrafluoride and compounds containing fluorine solely in the form of an $SiF_2$ or $SiF_3$ group bonded to silicon-containing moieties are not precluded, but they are not an advantageous sole source of fluorine at high frequency because they are excessively stable. For example, the use of $NF_3$ in conjunction with $SiH_4$ and a suitable concentration of another active nitrogen source such as $NH_3$ leads to desirable films. Thus, the inventive process yields an advantageous fabrication sequence for devices employing silicon nitride regions, e.g., devices encapsulated with silicon nitride.

BRIEF DESCRIPTION OF THE DRAWING

THE FIGURE is illustrative of a device involving an embodiment of the invention.

DETAILED DESCRIPTION

The inventive fabrication procedure includes a plasma deposition step for formation of silicon nitride. That is, the fabrication process utilizes device fabrication techniques such as described in *VLSI Technology*, S. M. Sze, ed., Chapter 3, McGraw-Hill, New York, 1983, and also includes the step of plasma depositing silicon nitride, 2 in the FIGURE, onto a body, 3 being processed into a device. However, this plasma deposition procedure requires the use of a specific gas combination. In particular, the gas in which the plasma is maintained should include sources of reactive nitrogen, reactive fluorine, reactive silicon, and reactive hydrogen. (In this context, the term gas also includes (1) aerosols, and (2) vapors produced from the interaction of the discharge with solids or liquids.)

A wide variety of sources for reactive nitrogen, e.g., nitrogen atoms or nitrogen-containing radicals, are available. For example, materials such as $NF_3$, hydrazine, or ammonia are useful. Although molecular nitrogen is employable, it does not easily dissociate in a high frequency plasma and, thus, only low levels of reactive nitrogen are formed. Since the relative proportions of nitrogen to fluorine and silicon to hydrogen should be maintained, this low level of nitrogen requires a correspondingly lower level of other entities. Thus, slower deposition rates are produced. Although lower deposition rates are not precluded, they are clearly less desirable. However, numerous nitrogen components are useful for producing reactive nitrogen. (It is desirable to avoid the use of explosive materials such as $N_2H_2$, $NCl_3$, $NI_3$, or materials that introduce undesirable atoms, e.g., sulfur and/or metals, into the plasma material.)

The source of reactive fluorine is also not critical. Numerous gases such as $NF_3$, HF, $ClF_3$, and $F_2$ are useful. The use of HF is not entirely desirable since it tends to severely corrode the deposition apparatus. However, if such corrosion is controlled, HF additions to the appropriate feed mixture produces satisfactory silicon nitride regions. The use as the only silicon source of $SiF_4$ and/or compounds containing fluorine bonded to silicon-containing moieties solely in the form of $SiF_2$ or $SiF_3$ is not desirable, at least at high discharge frequencies, because these sources are very stable and enhance destabilizing $SiF_2$ incorporation in the silicon nitride.

The presence of silicon and hydrogen are also required. The introduction of both these atoms is conveniently produced through the use of compounds such as $SiH_4$ or $Si_2H_6$. However, chlorinated or partially fluorinated silanes are useful provided sufficient hydrogen is present in the plasma region. As is apparent, the suggested gases for producing a suitable plasma mixture provide more than one of the necessary entities. Thus, a gas for each entity is not required. For example, the combination $NF_3$ and $SiH_4$ provides all the necessary ingredients to produce a high quality silicon nitride region. However, when active fluorine is derived from $NF_3$, to obtain a high quality fluorinated silicon nitride film a feed gas N/F atomic ratio greater than $\frac{1}{3}$ is required. Thus, in an $NF_3/SiH_4$ mixture the active nitrogen should be supplemented using an additional gas.

Although a precise atomistic explanation for the combination of fluorine, hydrogen, nitrogen, and silicon into excellent silicon nitride layers is not available, a contemplated explanation provides an excellent pedagogic aid to the understanding of the process. It is believed that fluorine present in the plasma preferentially bonds with silicon in the silicon nitride material either preventing formation of silicon-hydrogen bonds or replacing such bonds with silicon-fluorine bonds. Thus, the presence of silicon-hydrogen bonds in the resulting layer are substantially limited. However, the presence of excess fluorine in the plasma also results in N-F bonds and -$SiF_2$-linkages. The excess presence of N-F bonds is not desirable because they lead to a substantial chemical degradation (weak bonds) in the resulting silicon nitride film. Similarly, -$SiF_2$-linkages are extremely sensitive to degradation by moisture. Surprisingly, the presence of hydrogen in the plasma causes preferential reaction of the hydrogen with nitrogen in the silicon nitride film and prevents the excessive formation of N-F bonds, while limiting the amount of reactive fluorine prevents excessive formation of -$SiF_2$-linkages. Despite the substantial presence of hydrogen, silicon/fluorine bonds are preferentially formed over silicon/hydrogen bonds.

Clearly, an appropriate ratio of silicon to nitrogen is required to produce the desired stoichiometry. Additionally, appropriate levels of hydrogen and fluorine are required to avoid excessive N-F bonds and to insure appropriate formation of Si-F bonds in preference to Si-H bonds. The precise relative concentrations of source gases in the plasma to produce this desired result varies with the particular source gases employed. Thus, the specification of a universal range for the relative concentration of source gases is not practical. However, the relative ratios are easily determinable utilizing a controlled sample. In one embodiment, for an $SiH_4/NF_3/N_2$ feed mixture typically, it is desirable to have an $SiH_4$ to $N_2$ ratio in the gaseous plasma in the range 0.5 to 5 mole percent and $NF_3/SiH_4$ mole ratios in the range 0.2 to 1. Similarly, a gas mixture of $NF_3/NH_3/SiH_4/Ar$ in the proportion (2–4)/16/4/200 produces excellent silicon nitride. The atomic feed ratio of silicon to fluorine is also significant. For typical reaction mixtures, ratios in the range 0.6 to 4 are appropriately employed. As noted, irrespective of the particular combination of gases utilized, a substantial level of hydrogen is also required. This level varies with gas composition but should be sufficient to prevent the excessive formation of N-F bonds.

It has also been found that a low frequency discharge, e.g., a discharge utilizing a frequency below 2 MHz (the ion transit frequency), produces somewhat improved films. (However, films produced by a high frequency induced discharge--a frequency above the ion transit frequency--are still quite adequate and are not precluded.) It is contemplated that enhanced ion bombardment attained utilizing lower frequencies tends to break silicon-hydrogen and silicon-silicon bonds and ensures migration of fluorine and nitrogen within the film to react with the resulting silicon entity. Higher gas phase potentials also tend to enhance the dissociation of the more stable nitrogen-containing compounds such as $N_2$ to reactive nitrogen and dissociation of excessively stable fluorine-containing gas such as $SiF_4$ into reactive fluorine. Thus, at lower plasma frequencies, compounds such as $N_2$ and $SiF_4$ respectively as sources of nitrogen and fluorine are not precluded. It is also believed that ion bombardment through an unresolved means leads to improved film mechanical properties. The silicon nitrides involved in the subject invention are not only useful for passivation but also in many other applications such as those that require a low dielectric constant and/or transmission of light well into the ultraviolet. For example, films with dielectric constants as low as 4 have been obtained. Additionally, films with an optical band as high as 5.9 eV (approximately 210 nm) have also been obtained.

The following examples are illustrative of conditions relating to the subject invention.

Example 1

A silicon substrate 100 mm in diameter with its major surface in the (100) crystallographic plane was cleaned in dilute HF solution. The wafer was rinsed with deionized water and blown dry with nitrogen. A rectangular (1 cm×2 cm) sapphire substrate was cleaned in acetone and methanol with a subsequent rinse in deionized water. The rinsed sapphire substrate was then blown dry with dry nitrogen.

The silicon and sapphire substrates were placed on the heated lower electrode of a parallel plate plasma etching apparatus. The upper and lower electrodes were approximately 28 cm and 24 cm in diameter, respectively, and were spaced approximately 4 cm apart. The apparatus was evacuated to a pressure of approximately $5 \times 10^{-3}$ Torr. A gas flow containing 4 sccm of $SiH_4$, 2 sccm of $NF_3$, 200 sccm of molecular nitrogen, and 10 sccm of argon was introduced into the region between the electrodes to produce a total pressure of approximately 0.25 Torr. An Rf discharge was struck in the gas utilizing a frequency of 200 kHz and an applied power of approximately 250 watts. The substrate was heated to a temperature of approximately 300° C. The induced deposition was continued for 10 min. yielding a 5000 Å thick layer (deposition rate of 500 Å/min).

The film composition was measured utilizing Fourier transform infrared absorption, Rutherford backscattering, and Auger electron spectroscopies. This measurement indicated a N/Si ratio of approximately 1.3 and an F/Si ratio of approximately 0.35. The optical band gap (defined here as the photon energy at which the absorption coefficient is equal to $10^4$ cm$^{-1}$) of the film on the sapphire substrate was measured utilizing UV absorption spectroscopy and was 5.5 eV. Breakdown voltage and resistivity were measured by the current-voltage trace and were 4 MV/cm and $5 \times 10^{14}$ Ω-cm, respectively. The Si-H, N-H, and total hydrogen concentration was measured utilizing Fourier transform infrared spectroscopy and were respectively $1.8 \times 10^{21}$ cm$^{-3}$, $5.2 \times 10^{21}$ cm$^{-3}$, and 8 atomic percent. Compressive stress of the film was measured by radius of curvature and was $1.3 \times 10^9$ dyne/cm$^2$. The density of the film as measured by the weight change per unit area of the substrate before and after deposition divided by the film thickness was 2.7 to 3.1 g/cm$^3$.

Example 2

The procedure of Example 1 was followed except the gas flow contained 2.5 sccm of silane, 2.5 sccm of nitrogen trifluoride, 200 sccm of molecular nitrogen, and 10 sccm of argon. The total pressure in the chamber was approximately 0.5 Torr. The Rf frequency was 13.56 MHz. The substrate was heated to a temperature of 320° C. The band gap of the resulting film was 5.6 eV, Si-H concentration was $1.7 \times 10^{21}$ cm$^{-3}$, N-H concentration was $8 \times 10^{21}$ cm$^{-3}$, total hydrogen concentration was 10 atomic percent, N/Si was approximately 1.03, F/Si was approximately 0.47, and O/Si was approximately 0.2. Deposition rate was 1000 Å/min and the refractive index was 1.8.

Example 3

The procedure of Example 1 was followed except the gas contained 2 sccm of silane, 5 sccm of HF, 200 sccm of molecular nitrogen, and 10 sccm of argon with a total pressure of 0.5 Torr. The discharge frequency was 13.56 MHz. Film properties comparable to those of Example 1 were obtained such as a band gap of 4.9 eV, an N/Si of approximately 1.2, F/Si of approximately 0.4, a total hydrogen concentration of 11 atomic percent, a deposition rate of 320 Å/min, and a refractive index of 1.9.

Example 4

The procedure of Example 1 was followed except the gas contained 2 sccm of silane, 12 sccm of ammonia, 1.5 sccm of nitrogen trifluoride, and 200 sccm of argon producing a 0.5 Torr total pressure. The discharge frequency was 13.56 MHz. Film properties were comparable to those of Example 1 such as a band gap greater than 6 eV, a breakdown voltage of 5 MV/cm, a resistivity of $4 \times 10^{15}$ ohms-cm and a Si-H concentration less than $1 \times 10^{21}$ cm$^{-3}$. A total hydrogen concentration of 11 atomic percent, a stress of less than $10^7$ dyne/cm$^2$, a deposition rate of 400 Å/min, and a refractive index of approximately 1.8 were also observed.

What is claimed is:

1. A process for fabricating a device including an insulating material, said process comprising the steps of forming a region of said device and depositing a silicon nitride insulating material on said region by maintaining a discharge in a gas comprising (1) a source of reactive nitrogen, (2) a source of reactive fluorine, (3) a source of silicon including at least one silicon-containing compound having less than half the silicon bonding orbitals satisfied by fluorine moieties, and (4) a source of a substantial level of reactive hydrogen, while interacting the species from said discharge with said region to deposit a silicon nitride layer having a resistivity in the range of $10^{14}$ to $10^{16}$ ohm centimeters.

2. The process of claim 1 wherein said device comprises a semiconductor device.

3. The process of claim 1 wherein said source of reactive nitrogen comprises a member chosen from the group consisting of $N_2$, $NF_3$, hydrazine, and ammonia.

4. The process of claim 3 wherein said source of fluorine comprises a member chosen from the group consisting of $NF_3$, HF, $ClF_3$, and $F_2$.

5. The process of claim 4 wherein said source of silicon comprises a member chosen from the group of $SiH_4$ and $Si_2H_6$.

6. The process of claim 1 wherein said source of fluorine comprises a member chosen from the group consisting of $NF_3$, HF, $ClF_3$, and $F_2$.

7. The process of claim 1 wherein said source of silicon comprises a member chosen from the group consisting of $SiH_4$ and $Si_2H_6$.

8. The process of claim 1 wherein said gas comprises $NF_3$, $SiH_4$, and $NH_3$.

9. The process of claim 1 wherein said gas comprises $N_2$, $NF_3$, and $SiH_4$.

10. The process of claim 1 wherein said gas comprises $N_2$, HF, and $SiH_4$.

11. A device formed by the process comprising the steps of forming a region of said device and depositing a silicon nitride insulating material on said region by maintaining a discharge in a gas comprising (1) a source of reactive nitrogen, (2) a source of reactive fluorine, (3) a source of silicon including at least one silicon-containing compound having less than half the silicon bonding orbitals satisfied by fluorine moieties, and (4) a source of a substantial level of reactive hydrogen, while interacting the species from said discharge with said region to deposit a silicon nitride layer having a resistivity in the range of $10^{14}$ to $10^{16}$ ohm centimeters.

12. The device of claim 11 wherein said device comprises a semiconductor device.

13. The device of claim 11 wherein said source of reactive nitrogen comprises a member chosen from the group consisting of $N_2$, $NF_3$, hydrazine, and ammonia.

14. The device of claim 13 wherein said source of fluorine comprises a member chosen from the group consisting of $NF_3$, $HF$, $ClF_3$, and $F_2$.

15. The device of claim 14 wherein said source of silicon comprises a member chosen from the group consisting of $SiH_4$ and $Si_2H_6$.

16. The device of claim 11 wherein said source of fluorine comprises a member chosen from the group consisting of $NF_3$, $HF$, $ClF_3$, and $F_2$.

17. The device of claim 11 wherein said source of silicon comprises a member chosen from the group consisting of $SiH_4$ and $Si_2H_6$.

18. The device of claim 11 wherein said gas comprises $NF_3$, $SiH_4$, and $NH_3$.

19. The device of claim 11 wherein said gas comprises $N_2$, $NF_3$, and $SiH_4$.

20. The device of claim 11 wherein said gas comprises $N_2$, $HF$, and $SiH_4$.

21. A process for fabricating a device comprising the steps of forming a region of said device and depositing a silicon nitride layer on said region by maintaining a discharge in a gas comprising (1) a source of reactive nitrogen, (2) a source of reactive fluorine, (3) a source of silicon including at least one silicon-containing compound having less than half the silicon bonding orbitals satisfied by fluorine moieties, and (4) a source of a substantial level of reactive hydrogen, the process comprising the further step of formulating said gas comprising the aforesaid (1), (2), (3), and (4) ingredients in proportions to so as to produce an electrically insulating silicon nitride layer having a resistivity in the range of $10^{14}$ to $10^{16}$ ohm centimeters on said region.

22. The process of claim 21 in which the ingredients (1), (2), (3), and (4) are gasses consisting essentially of one or more constituent elements selected from the group consisting of F, Cl, N, H and Si.

23. The process of claim 22 wherein the gas consists of elemental or combined species of F, Cl, N, H, and Si.

* * * * *